(12) United States Patent
You

(10) Patent No.: US 12,268,059 B2
(45) Date of Patent: Apr. 1, 2025

(54) DISPLAY PANEL AND METHOD OF MANUFACTURING THE SAME

(71) Applicant: Samsung Display Co., LTD., Yongin-si (KR)

(72) Inventor: Chungi You, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 450 days.

(21) Appl. No.: 17/848,182

(22) Filed: Jun. 23, 2022

(65) Prior Publication Data

US 2023/0137000 A1 May 4, 2023

(30) Foreign Application Priority Data

Nov. 3, 2021 (KR) .................. 10-2021-0150084

(51) Int. Cl.
| | | |
|---|---|---|
| *H10K 50/86* | (2023.01) | |
| *H10K 59/122* | (2023.01) | |
| *H10K 59/124* | (2023.01) | |
| *H10K 71/00* | (2023.01) | |
| H10K 59/12 | (2023.01) | |

(52) U.S. Cl.
CPC .......... *H10K 59/124* (2023.02); *H10K 50/86* (2023.02); *H10K 71/00* (2023.02); *H10K 59/1201* (2023.02); *H10K 59/122* (2023.02)

(58) Field of Classification Search
CPC .... H10K 59/124; H10K 50/86; H10K 59/122; H10K 59/8723; H10K 59/8791
See application file for complete search history.

(56) References Cited

U.S. PATENT DOCUMENTS

| | | | | |
|---|---|---|---|---|
| 2021/0126081 A1* | 4/2021 | Moon | .................. | H10K 59/122 |
| 2022/0013603 A1* | 1/2022 | Kim | .................. | H10K 59/8722 |
| 2023/0217724 A1* | 7/2023 | Ryoo | .................. | H10K 59/122 |
| | | | | 257/40 |
| 2024/0206236 A1* | 6/2024 | Kim | ..................... | H10K 59/122 |

FOREIGN PATENT DOCUMENTS

| | | |
|---|---|---|
| KR | 10-0141047 A | 3/1998 |
| KR | 10-2020-0027600 A | 3/2020 |
| KR | 10-2020-0067524 A | 6/2020 |
| KR | 10-2021-0014233 A | 2/2021 |

* cited by examiner

*Primary Examiner* — David Vu
*Assistant Examiner* — Brandon C Fox
(74) *Attorney, Agent, or Firm* — Womble Bond Dickinson (US) LLP

(57) ABSTRACT

A display panel includes: a substrate; a transistor on the substrate; a planarization layer on the transistor, and defining at least one recess; a first pixel electrode and a second pixel electrode on the planarization layer, with the recess therebetween in a plan view; a metal pattern on the planarization layer, and adjacent to the first pixel electrode or the second pixel electrode; a pixel defining layer on the metal pattern and filling the recess; and a spacer on the pixel defining layer and overlapping with the metal pattern.

20 Claims, 22 Drawing Sheets

DISPLAY PANEL AND METHOD OF MANUFACTURING THE SAME

CROSS-REFERENCE TO RELATED APPLICATION(S)

This application claims priority to and the benefit of Korean Patent Application No. 10-2021-0150084, filed on Nov. 3, 2021 in the Korean Intellectual Property Office (KIPO), the entire disclosure of which is incorporated by reference herein.

BACKGROUND

1. Field

Aspects of embodiments of the present disclosure relate to a display panel, and particularly, to a display panel and a method of manufacturing the display panel.

2. Description of the Related Art

A display device is a device that displays an image for providing visual information to a user. From among display devices, an organic light emitting diode display has recently attracted attention.

The organic light emitting display device is being applied to various suitable electronic devices, such as mobile devices (e.g., smartphones and tablets), monitors, televisions, and the like. In addition, the organic light emitting display device is also being applied to a display device for automobiles.

The above information disclosed in this Background section is for enhancement of understanding of the background of the present disclosure, and therefore, it may contain information that does not constitute prior art.

SUMMARY

One or more embodiments of the present disclosure are directed to a display panel having improved reliability.

One or more embodiments of the present disclosure are directed to a method of manufacturing the display panel.

According to one or more embodiments of the present disclosure, a display panel includes: a substrate; a transistor on the substrate; a planarization layer on the transistor, and defining at least one recess; a first pixel electrode and a second pixel electrode on the planarization layer, with the recess therebetween in a plan view; a metal pattern on the planarization layer, and adjacent to the first pixel electrode or the second pixel electrode; a pixel defining layer on the metal pattern and filling the recess; and a spacer on the pixel defining layer and overlapping with the metal pattern.

In an embodiment, at least a portion of an edge of each of the first pixel electrode and the second pixel electrode may be connected to an edge of the recess.

In an embodiment, at least a portion of an edge of each of the first pixel electrode and the second pixel electrode may protrude to cover a portion of the recess.

In an embodiment, the spacer may be spaced from the first pixel electrode and the second pixel electrode in a plan view.

In an embodiment, the display panel may further include a passivation layer located between the transistor and the planarization layer.

In an embodiment, the recess may pass through the planarization layer.

In an embodiment, the recess may expose the passivation layer.

In an embodiment, the passivation layer may contact the pixel defining layer.

In an embodiment, a portion of the planarization layer may be located under the recess.

In an embodiment, the recess may be defined in an upper surface of the planarization layer.

According to one or more embodiments of the present disclosure, a method of manufacturing a display panel, includes: forming a transistor on a substrate; forming a planarization layer on the transistor; forming a preliminary electrode layer on the planarization layer; patterning the preliminary electrode layer to form a first pixel electrode and a second pixel electrode adjacent to the first pixel electrode, and to expose the planarization layer; and forming a recess in the planarization layer by removing a portion of the planarization layer located between the first pixel electrode and the second pixel electrode.

In an embodiment, the recess may be formed to be spaced from the first pixel electrode and the second pixel electrode in a plan view.

In an embodiment, the patterning of the preliminary electrode layer may include forming a metal pattern adjacent to the first pixel electrode and the second pixel electrode.

In an embodiment, the method may further include forming a pixel defining layer on the first pixel electrode, the second pixel electrode, and the metal pattern.

In an embodiment, the pixel defining layer may fill the recess.

In an embodiment, the method may further include forming a spacer on the pixel defining layer.

In an embodiment, the spacer may overlap with the metal pattern.

In an embodiment, the method may further include forming a passivation layer on the transistor.

In an embodiment, the recess may pass through the planarization layer, and may expose the passivation layer.

In an embodiment, a portion of the planarization layer may remain under the recess.

In a display device according to one or more embodiments of the present disclosure, because the recess may be defined in the planarization layer, an open rate of the planarization layer included in the display panel may be increased. Accordingly, a pixel reduction phenomenon of the display panel due to sunlight may be improved.

According to one or more embodiments of the present disclosure, the metal pattern may overlap with the spacer, and may support the spacer. Accordingly, because the spacer may maintain or substantially maintain a gap between the encapsulation layer and the substrate, reliability of the display panel may be improved.

According to one or more embodiments of the present disclosure, the planarization layer may be removed by using the electrode layer as a mask. By using the electrode layer as a mask, a manufacturing process of the display panel may be simplified.

According to one or more embodiments of the present disclosure, by using the electrode layer as a mask, an edge of the opening may coincide with at least a portion of an edge of the electrode layer, or the edge of the opening may have an undercut shape. Accordingly, an open rate of the planarization layer may be increased.

BRIEF DESCRIPTION OF THE DRAWINGS

The above and other aspects and features of the present disclosure will be more clearly understood from the following detailed description of the illustrative, non-limiting embodiments with reference to the accompanying drawings.

DETAILED DESCRIPTION

Figure 1:
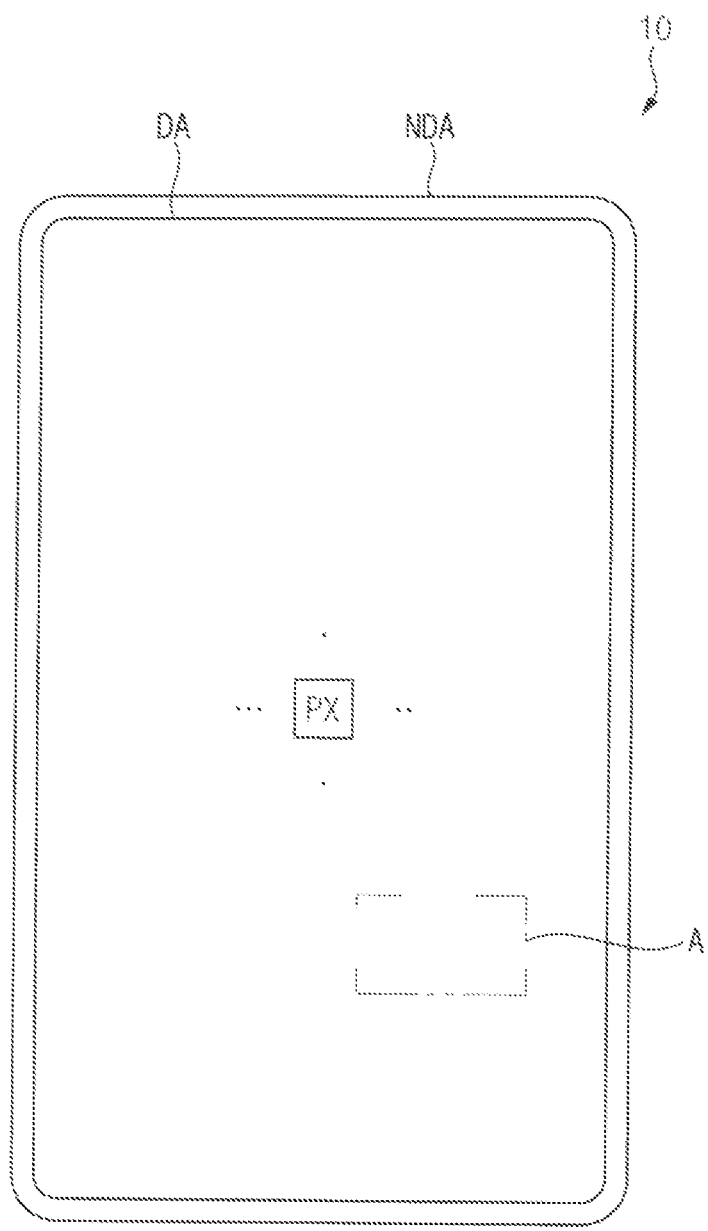
FIG. 1 is a plan view illustrating a display panel according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view illustrating a display panel according to an embodiment.

Referring to FIG. 1, a display panel 10 may include a display area DA and a non-display area NDA. The display area DA may be an area for displaying an image. A planar shape of the display area DA may be a rectangular shape (e.g., with right-angled corners), or a rectangular shape with rounded corners as shown in FIG. 1. However, the planar shape of the display area DA is not limited thereto, and the display area DA may have various suitable planar shapes, such as a circle, an ellipse, and a polygon.

The non-display area NDA may be disposed around (e.g., adjacent to) the display area DA. The non-display area NDA may surround (e.g., around a periphery of) the display area DA. The non-display area NDA may be an area that does not display an image. In an embodiment, drivers for driving pixels PX located at (e.g., in or on) the display area DA may be disposed at (e.g., in or on) the non-display area NDA.

The pixels PX may be arranged in a matrix form at (e.g., in or on) the display area DA. Signal lines, for example, such as gate lines and data lines, may be disposed at (e.g., in or on) the display area DA. Each of the signal lines, such as the gate line and the data line, may be connected to corresponding ones of the pixels PX. Each of the pixels PX may receive a gate signal, a data signal, and the like from a corresponding signal line.

Figure 2:
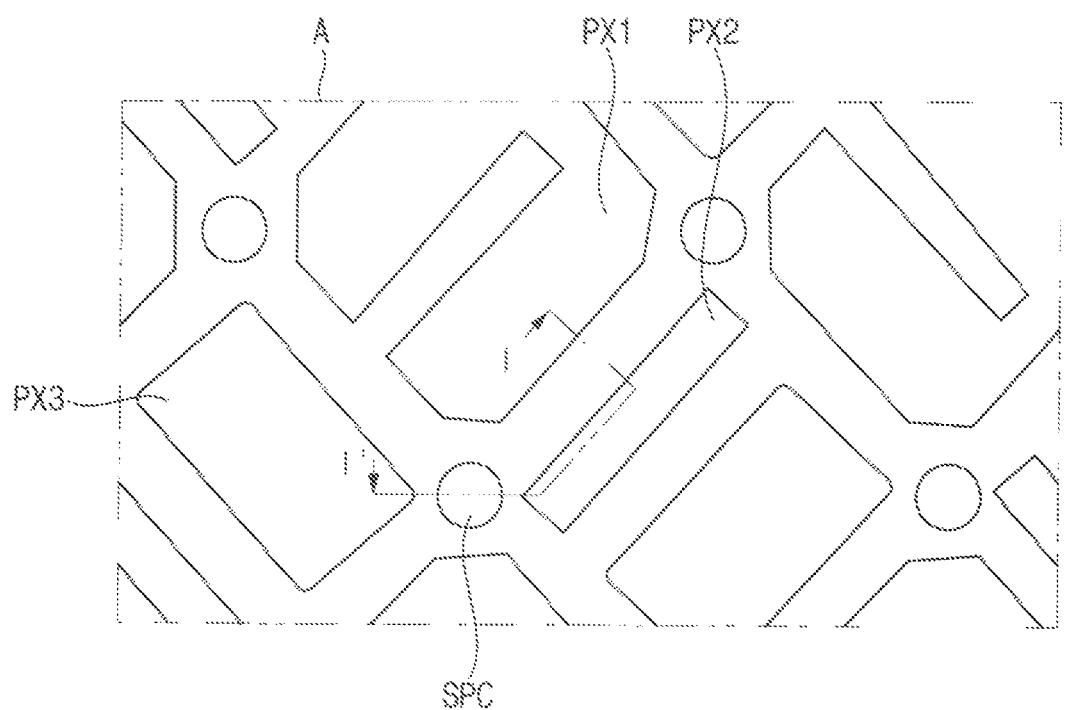
FIG. 2 is an enlarged view of the area A of FIG. 1.
Figure 3:
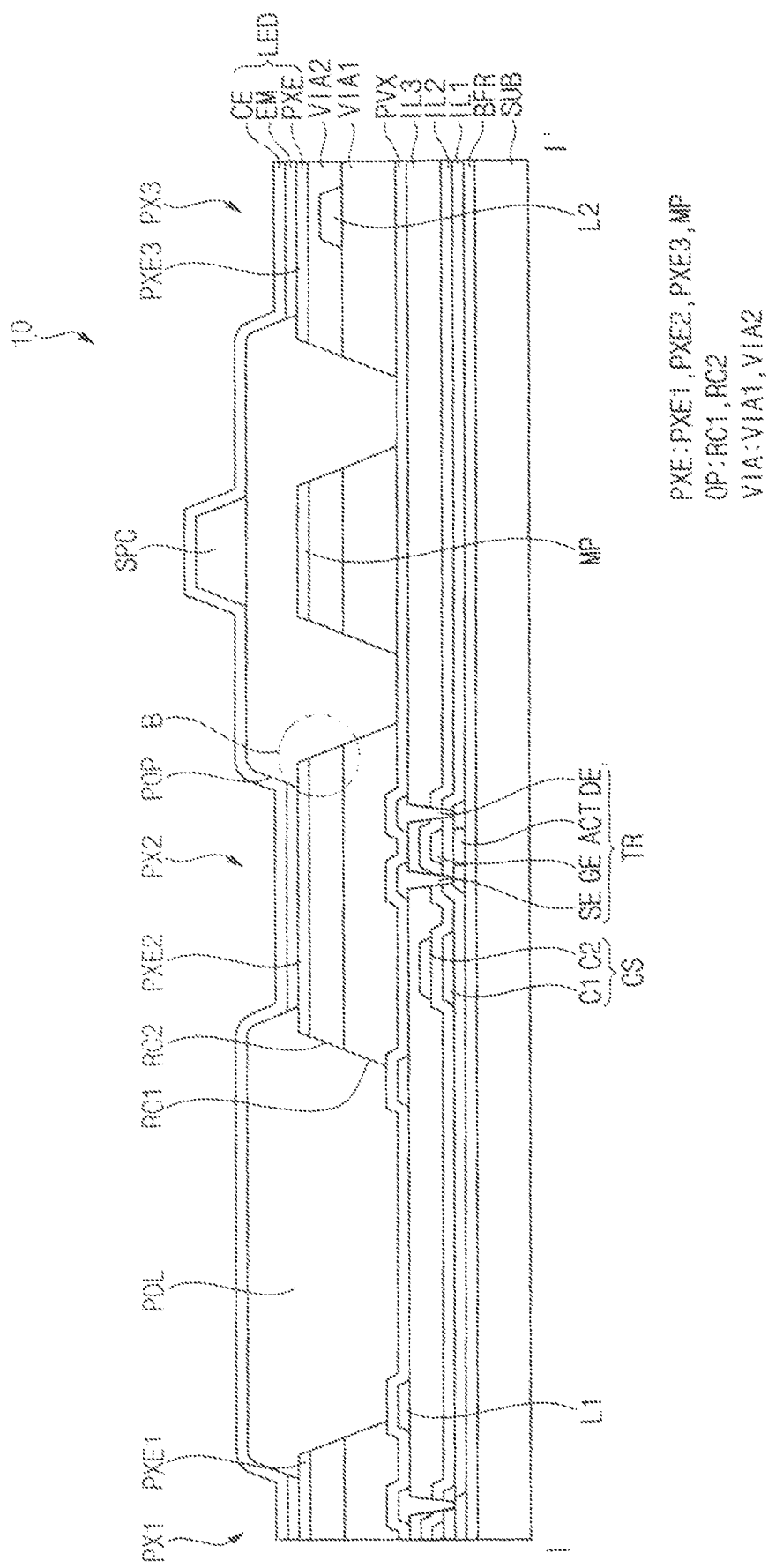
FIG. 3 is a cross-sectional view taken along the line I-I' in FIG. 2.

FIG. 2 is an enlarged view of the area A of FIG. 1. FIG. 3 is a cross-sectional view taken along the line I-I' in FIG. 2.

Referring to FIGS. 1 and 2, the pixels PX may be disposed at (e.g., in or on) the display area DA. The pixels PX may be arranged in a suitable arrangement (e.g., a predetermined arrangement) at (e.g., in or on) the display area DA. The pixels PX may include a first pixel PX1, a second pixel PX2, and a third pixel PX3. The first pixel PX1, the second pixel PX2, and the third pixel PX3 may be adjacent to each other. The first pixel PX1, the second pixel PX2, and the third pixel PX3 may display different primary colors from each other. The primary colors may include (e.g., may be) red, green, and blue. Each of the first pixel PX1, the second pixel PX2, and the third pixel PX3 may display one of red, green, and blue colors. For example, the first pixel PX1 may display blue. The second pixel PX2 may display red. The third pixel PX3 may display green. The first pixel PX1, the second pixel PX2, and the third pixel PX3 may form one pixel unit, and a plurality of pixel units may be arranged at (e.g., in or on) the display area DA. The pixel units may be repeatedly arranged in a suitable arrangement (e.g., a predetermined arrangement) at (e.g., in or on) the display area DA.

However, the present disclosure is not limited thereto, and one pixel unit may include more than three pixels. For example, one pixel unit may further include a pixel capable of displaying a color different from those of the first pixel PX1, the second pixel PX2, and the third pixel PX3. As another example, one pixel unit may further include a pixel capable of displaying the same or substantially the same color (or similar color) as that of any one of the first pixel PX1, the second pixel PX2, and the third pixel PX3. In another embodiment, one pixel unit may not include one or more (or any one) of the first pixel PX1, the second pixel PX2, and the third pixel PX3.

Referring to FIGS. 1, 2, and 3, the display panel 10 may include a substrate SUB, a buffer layer BFR, a transistor TR, a storage capacitor CS, a first insulation layer IL1, a second insulation layer IL2, a third insulation layer IL3, a first wiring L1, a passivation layer PVX, a first planarization layer VIA1, a second wiring L2, a second planarization layer VIA2, an electrode layer PXE, a light emitting layer EM, a common electrode CE, a pixel defining layer PDL, a spacer SPC, and an encapsulation layer. The transistor TR may include an active layer ACT, a gate electrode GE, a source electrode SE, and a drain electrode DE. The storage capacitor CS may include a first capacitor electrode C1 and a second capacitor electrode C2.

The substrate SUB may be formed of a transparent material or an opaque material. The substrate SUB may be formed of glass, quartz, plastic, or the like. Examples of the plastic may include polyimide, polyethylene naphthalate, polyethylene terephthalate, polyarylate, polycarbonate, polyetherimide, polyethersulfone, and the like. These materials may be used alone or in any suitable combinations with each other.

In some embodiments, a barrier layer may be disposed on the substrate SUB. Examples of a material for forming the barrier layer may include silicon compounds, such as amorphous silicon, silicon oxide, and silicon nitride. These materials may be used alone or in any suitable combinations with each other.

The buffer layer BFR may be disposed on the barrier layer. The buffer layer BFR may prevent or substantially prevent diffusion of metal atoms and/or impurities from the substrate SUB to the active layer ACT.

The active layer ACT may be disposed on the buffer layer BFR. The active layer ACT may be divided into a source region and a drain region that are doped with impurities, and a channel region between the source region and the drain region.

The first insulation layer IL1 may be disposed on the buffer layer BFR. The first insulation layer IL1 may cover the active layer ACT, and may be formed to have the same or substantially the same thickness along a profile of the active layer ACT. However, the present disclosure is not limited thereto. For example, the first insulation layer IL1 may include an inorganic material.

The gate electrode GE may be disposed on the first insulation layer IL1. The gate electrode GE may overlap with the channel region of the active layer ACT.

The first capacitor electrode C1 may be disposed on the first insulation layer IL1. The first capacitor electrode C1 may be spaced apart from the gate electrode GE.

The second insulation layer IL2 may be disposed on the first insulation layer IL1. In addition, the second insulation layer IL2 may cover the gate electrode GE and the first capacitor electrode C1, and may be disposed to have the same or substantially the same thickness along the profiles of the gate electrode GE and the first capacitor electrode C1. However, the present disclosure is not limited thereto.

The second capacitor electrode C2 may be disposed on the second insulation layer IL2. The second capacitor electrode C2 may overlap with the first capacitor electrode C1. The first capacitor electrode C1 and the second capacitor electrode C2 may constitute the storage capacitor CS. The storage capacitor CS may serve as a capacitor.

The third insulation layer IL3 may be disposed on the second insulation layer IL2. The third insulation layer IL3 may cover the second capacitor electrode C2.

The source electrode SE and the drain electrode DE may be disposed on the third insulation layer IL3. The source electrode SE may contact the source region of the active layer ACT through a first contact hole formed in (e.g., penetrating) the first to third insulation layers IL1, IL2, and IL3. The drain electrode DE may contact the drain region of the active layer ACT through a second contact hole formed in (e.g., penetrating) the first to third insulation layers IL1, IL2, and IL3.

The active layer ACT, the gate electrode GE, the source electrode SE, and the drain electrode DE may constitute the transistor TR.

The first wiring L1 may be disposed on the third insulation layer IL3. For example, the first wiring L1 may be the signal lines, such as the gate line or the data line.

The passivation layer PVX may be disposed on the third insulation layer IL3. The passivation layer PVX may be an insulation layer. The passivation layer PVX may cover the source electrode SE, the drain electrode DE, and the first wiring L1. The passivation layer PVX may be disposed to have the same or substantially the same thickness along the profiles of the source electrode SE, the drain electrode DE, and the first wiring L1. However, the present disclosure is not limited thereto.

The first planarization layer VIA1 may be disposed on the passivation layer PVX. At least one recess may be defined in the first planarization layer VIA1. In an embodiment, a first recess RC1 may be defined in the first planarization layer VIA1. The first recess RC1 may pass through (e.g., penetrate) the first planarization layer VIA1. The first recess RC1 may expose the passivation layer PVX.

The second wiring L2 may be disposed on the first planarization layer VIA1. The second wiring L2 may be the data line or a power line.

The second planarization layer VIA2 may be disposed on the first planarization layer VIA1, and may cover the second wiring L2. The first planarization layer VIA1 and the second planarization layer VIA2 may constitute a planarization layer VIA.

At least one recess may be defined in the second planarization layer VIA2. In an embodiment, a second recess RC2 may be defined in the second planarization layer VIA2. The second recess RC2 may pass through (e.g., may penetrate) the second planarization layer VIA2. The second recess RC2 may overlap with the first recess RC1. The first recess RC1 and the second recess RC2 may constitute one opening OP.

However, the present disclosure is not limited thereto, and the display panel 10 may include only one planarization layer. In addition, at least one recess may be defined in the one planarization layer.

The electrode layer PXE may be disposed on the second planarization layer VIA2. The electrode layer PXE may include a first pixel electrode PXE1, a second pixel electrode PXE2, a third pixel electrode PXE3, and a metal pattern MP. The first pixel electrode PXE1, the second pixel electrode PXE2, the third pixel electrode PXE3, and the metal pattern MP may be adjacent to each other. The first pixel electrode PXE1, the second pixel electrode PXE2, the third pixel electrode PXE3, and the metal pattern MP may not overlap with the opening OP.

In an embodiment, the opening OP may be disposed between the electrodes PXE1, PXE2, and PXE3, and the metal pattern MP included in the electrode layer PXE. For example, the opening OP may be disposed between the first pixel electrode PXE1 and the second pixel electrode PXE2. The opening OP may be disposed between the second pixel electrode PXE2 and the metal pattern MP. The opening OP may be disposed between the metal pattern MP and the third pixel electrode PXE3. Hereinafter, the first pixel electrode PXE1, the second pixel electrode PXE2, and the metal pattern MP will be mainly described in more detail.

The second pixel electrode PXE2 may be adjacent to the first pixel electrode PXE1. The metal pattern MP may be adjacent to the first pixel electrode PXE1 and the second pixel electrode PXE2 in a plan view. The metal pattern MP may be spaced apart (e.g., separated) from the first pixel electrode PXE1 and the second pixel electrode PXE2. However, the present disclosure is not limited thereto, and in another embodiment, the metal pattern MP may be connected to the first pixel electrode PXE1 and the second pixel electrode PXE2.

The electrode layer PXE may have light-transmitting properties or reflective properties. For example, the electrode layer PXE may be formed of a metal.

A shape of the opening OP is not particularly limited. In an embodiment, the opening OP may surround (e.g., around peripheries of) the electrodes PXE1, PXE2, and PXE3, and the metal pattern MP included in the electrode layer PXE. However, the present disclosure is not limited thereto, and the opening OP may surround a portion (e.g., may surround around a part of the peripheries) of the electrodes PXE1, PXE2, and PXE3, and the metal pattern MP included in the electrode layer PXE.

The pixel defining layer PDL may be disposed on the electrode layer PXE. The pixel defining layer PDL may cover the metal pattern MP. The pixel defining layer PDL may be disposed in the first recess RC1 and the second recess RC2.

A pixel opening POP overlapping with the first pixel electrode PXE1 may be defined in (e.g., may penetrate) the pixel defining layer PDL. The pixel opening POP overlapping with the second pixel electrode PXE2 may be defined in (e.g., may penetrate) the pixel defining layer PDL. Accordingly, the pixel defining layer PDL may expose the first pixel electrode PXE1 and the second pixel electrode PXE2.

The pixel defining layer PDL may fill the opening OP. The pixel defining layer PDL may be disposed in the opening OP to contact the passivation layer PVX.

The spacer SPC may be disposed on the pixel defining layer PDL. The spacer SPC may overlap with the metal pattern MP. The spacer SPC may be disposed between the pixel electrodes. The spacer SPC may be spaced apart from the first pixel electrode PXE1 and the second pixel electrode PXE2 in a plan view. The spacer SPC may not overlap with the first pixel electrode PXE1 and the second pixel electrode PXE2.

The spacer SPC may be disposed on the pixel defining layer PDL, and may maintain or substantially maintain a gap between the encapsulation layer and the substrate SUB. The metal pattern MP may overlap with the spacer SPC, and may support the spacer SPC.

The light emitting layer EM may be disposed on each of the first pixel electrode PXE1 and the second pixel electrode PXE2. The light emitting layer EM may be disposed in the pixel opening POP defined in the pixel defining layer PDL. In an embodiment, the light emitting layer EM may have a multilayered structure including a hole injection layer, a hole transport layer, an organic emission layer, an electron transport layer, and an electron injection layer. The organic emission layer may include a light emitting material.

The common electrode CE may be disposed on the pixel defining layer PDL. The common electrode CE may cover the light emitting layer EM and the spacer SPC, and may be disposed on the pixel defining layer PDL. The common electrode CE may have transmissive properties or reflective properties. For example, the common electrode CE may be formed of a metal.

The first pixel electrode PXE1, the light emitting layer EM, and the common electrode CE may constitute a light emitting diode LED of the first pixel PX1. The second pixel electrode PXE2, the light emitting layer EM, and the common electrode CE may constitute a light emitting diode LED of the second pixel PX2. The third pixel electrode PXE3, the light emitting layer EM, and the common electrode CE may constitute a light emitting diode LED of the third pixel PX3. In an embodiment, each of the first pixel electrode PXE1, the second pixel electrode PXE2, and the third pixel electrode PXE3 may be a pixel electrode included in a corresponding light emitting diode LED.

The encapsulation layer may be disposed on the common electrode CE. The encapsulation layer may include a first inorganic encapsulation layer, an organic encapsulation layer, and a second inorganic encapsulation layer. The encapsulation layer may prevent or substantially prevent moisture and/or oxygen from penetrating into the display panel 10 from the outside.

In an embodiment, because the opening OP is defined in the first planarization layer VIA1 and the second planarization layer VIA2, an open rate of the planarization layer VIA included in the display panel 10 may be increased. Accordingly, the display panel 10 according to the present embodiment may improve a reduction of the pixel PXL due to sunlight. The open rate may be a ratio of an area of the opening OP from among the areas of the display panel 10.

In an embodiment, the metal pattern MP may overlap with the spacer SPC, and may support the spacer SPC. Because the spacer SPC is supported by the metal pattern MP, a shape of the spacer SPC protruding from the pixel defining layer PDL may be maintained or substantially maintained. Accordingly, because the spacer SPC may maintain or substantially maintain a gap between the encapsulation layer and the substrate SUB, reliability of the display panel 10 may be improved.

Figure 4:
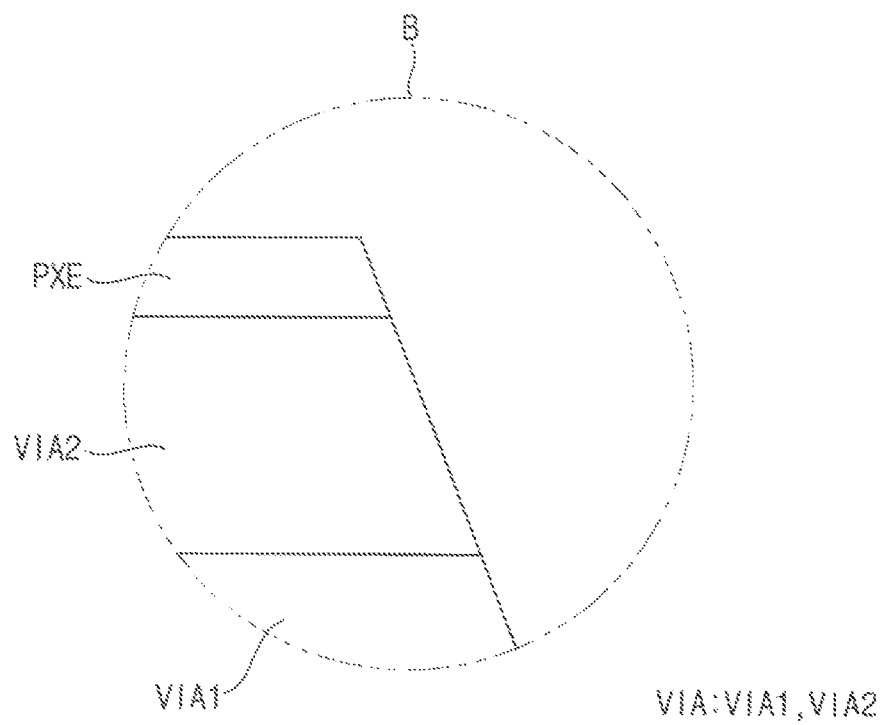
FIG. 4 is an enlarged view of the area B of FIG. 3.

FIG. 4 is an enlarged view of the area B of FIG. 3.

Referring to FIGS. 3 and 4, at least a portion of an edge of each of the first pixel electrode PXE1 and the second pixel electrode PXE2 may be connected to an edge of the opening OP. In other words, an edge of each of the first pixel electrode PXE1 and the second pixel electrode PXE2 may coincide with an edge of the opening OP.

When the opening OP surrounds (e.g., around peripheries of) the first pixel electrode PXE1 and the second pixel electrode PXE2, the edge of each of the first pixel electrode PXE1 and the second pixel electrode PXE2 may be entirely connected to the edge of the opening OP. When the opening OP surrounds (e.g., around) only a portion of the first pixel electrode PXE1 and the second pixel electrode PXE2, the edge of each of the first pixel electrode PXE1 and the second pixel electrode PXE2 may be partially connected to an edge of the opening OP.

In an embodiment, the open rate of the planarization layer VIA may be increased by connecting the edges of the first pixel electrode PXE1 and the second pixel electrode PXE2 to the edge of the opening OP. Accordingly, the display panel 10 according to the present embodiment may improve the reduction of the pixel PXL due to sunlight.

Figure 5:
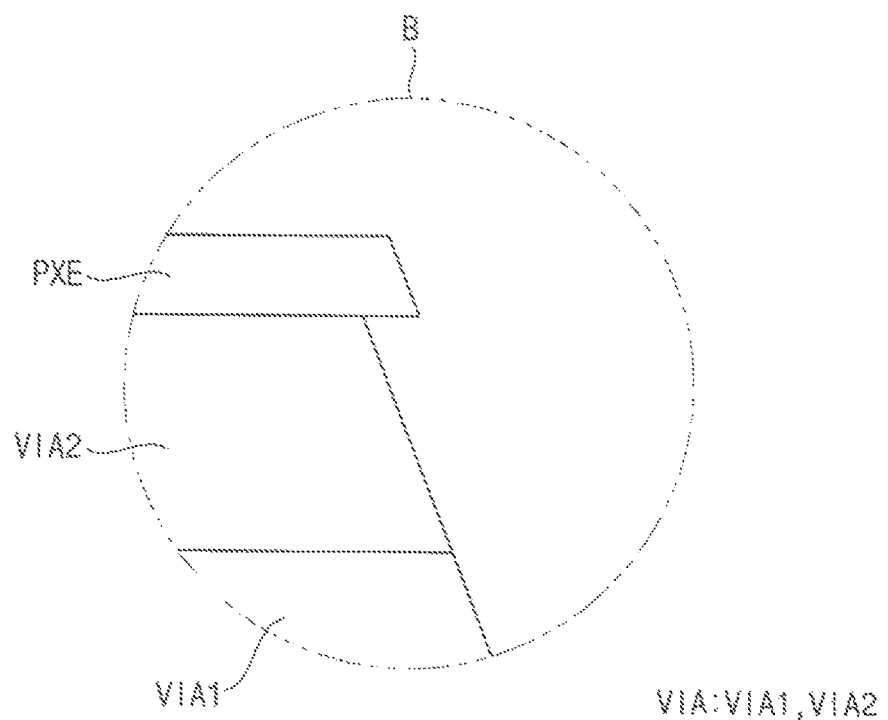
FIG. 5 is an enlarged view illustrating another example of the area B of FIG. 3.

FIG. 5 is an enlarged view illustrating another example of the area B of FIG. 3.

Referring to FIGS. 3 and 5, at least a portion of an edge of each of the first pixel electrode PXE1 and the second pixel electrode PXE2 may protrude to cover a portion of the opening OP. In other words, an edge of the opening OP may be positioned more inwardly than an edge of each of the first pixel electrode PXE1 and the second pixel electrode PXE2. Accordingly, the protruding edge of each of the first pixel electrode PXE1 and the second pixel electrode PXE2 may cover a portion of the opening OP.

When the opening OP surrounds (e.g., around peripheries of) the first pixel electrode PXE1 and the second pixel electrode PXE2, the edge of each of the first pixel electrode PXE1 and the second pixel electrode PXE2 may protrude to entirely cover a portion of the opening OP. When the opening OP surrounds (e.g., around) only a portion of the first pixel electrode PXE1 and the second pixel electrode PXE2, the edge of each of the first pixel electrode PXE1 and the second pixel electrode PXE2 may protrude to partially cover a portion of the opening OP.

In an embodiment, as the edges of the first pixel electrode PXE1 and the second pixel electrode PXE2 protrude to cover a portion of the opening OP, the open rate of the planarization layer VIA may be increased. Accordingly, the display panel 10 according to the present embodiment may improve the reduction of the pixel PXL due to sunlight.

Figure 6:
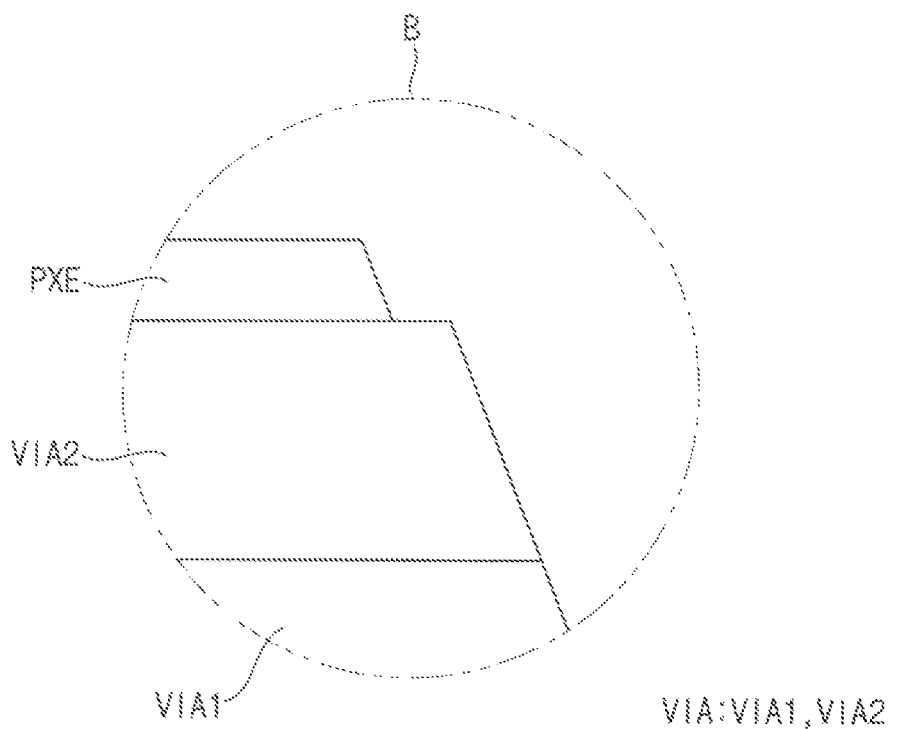
FIG. 6 is an enlarged view illustrating another example of the area B of FIG. 3.

FIG. 6 is an enlarged view illustrating another example of the area B of FIG. 3.

Referring to FIGS. 3 and 6, at least a portion of the edge of the planarization layer VIA may protrude toward the opening OP, rather than the edge of each of the first pixel electrode PXE1 and the second pixel electrode PXE2. In other words, the edge of each of the first pixel electrode PXE1 and the second pixel electrode PXE2 may be positioned more inwardly than the edge of the opening OP.

When the opening OP surrounds (e.g., around peripheries of) the first pixel electrode PXE1 and the second pixel electrode PXE2, the edge of the planarization layer VIA may entirely protrude toward the opening OP, rather than the edge of each of the first pixel electrode PXE1 and the second pixel electrode PXE2. When the opening OP surrounds (e.g., around) only a portion of the first pixel electrode PXE1 and the second pixel electrode PXE2, the edge of the planarization layer VIA may partially protrude toward the opening OP, rather than the edge of each of the first pixel electrode PXE1 and the second pixel electrode PXE2.

Figure 7:
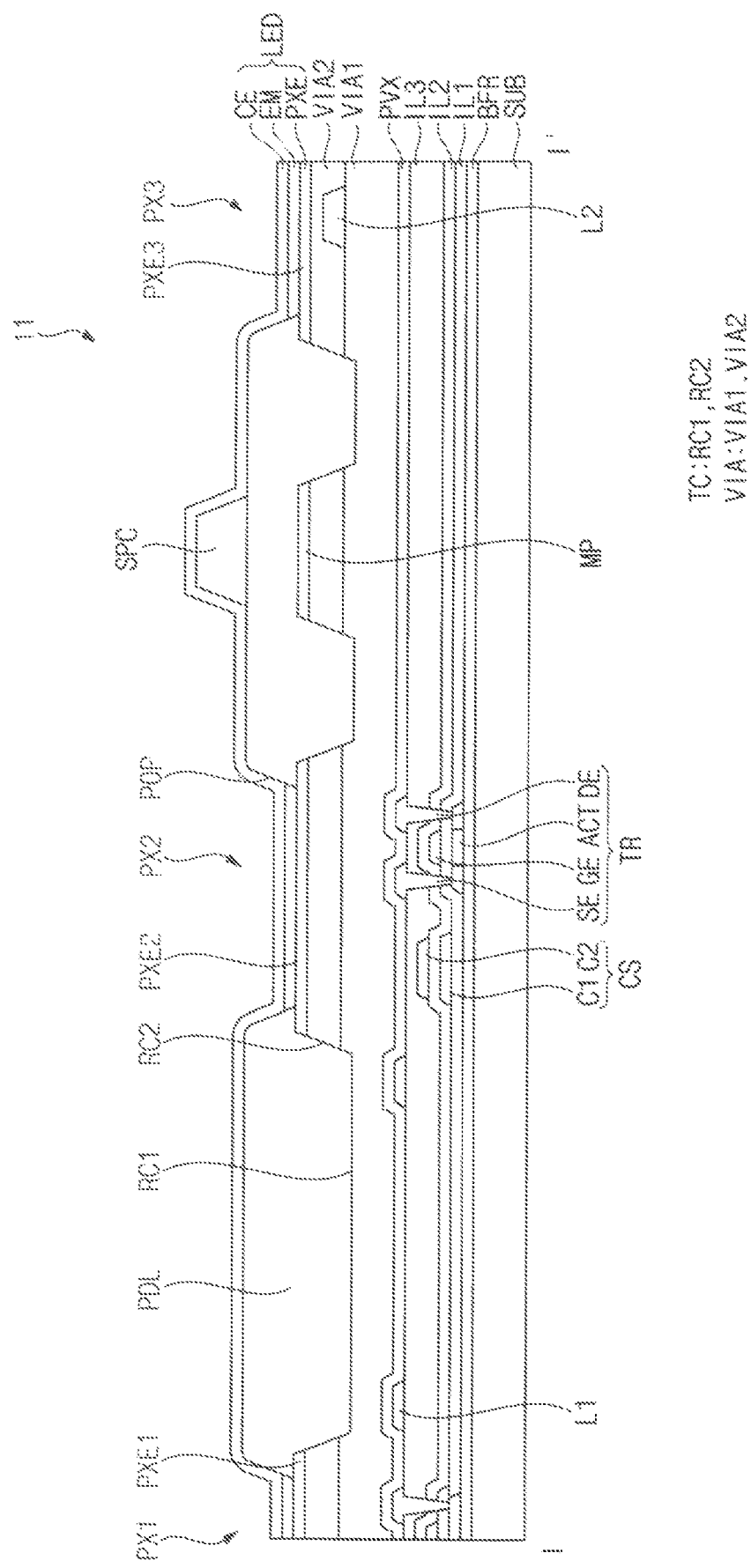
FIG. 7 is a cross-sectional view illustrating another example taken along the line I-I' in FIG. 2.

FIG. 7 is a cross-sectional view illustrating another example taken along the line I-I' in FIG. 2. A display panel 11 of FIG. 7 may have a configuration that is the same or substantially the same as (or similar to) the display panel 10 shown in FIG. 3, except that in FIG. 7, a trench is defined instead of an opening in the first planarization layer VIA1. Therefore, in FIG. 7, the components that are the same or substantially the same as those described above with reference to FIG. 3 are denoted with the same reference symbols, and thus, redundant description thereof may not be repeated.

Referring to FIGS. 1, 2, and 7, the display panel 11 may include a substrate SUB, a buffer layer BFR, a transistor TR, a storage capacitor CS, a first insulation layer IL1, a second insulation layer IL2, a third insulation layer IL3, a first wiring L1, a passivation layer PVX, a first planarization layer VIA1, a second wiring L2, a second planarization layer VIA2, an electrode layer PXE, a light emitting layer EM, a common electrode CE, a pixel defining layer PDL, a spacer SPC, and an encapsulation layer. The transistor TR may include an active layer ACT, a gate electrode GE, a source electrode SE, and a drain electrode DE.

At least one recess may be defined in the first planarization layer VIA1. In an embodiment, a first recess RC1 may be defined in the first planarization layer VIA1. The first recess RC1 may have a trench shape. A portion of the planarization layer VIA (e.g., a portion of the first planarization layer VIA1) may be disposed under (e.g., underneath) the first recess RC1. The first recess RC1 may be formed at (e.g., in or on) an upper surface of the first planarization layer VIA1.

The second planarization layer VIA2 may be disposed on the first planarization layer VIA1. At least one recess may be defined in the second planarization layer VIA2. In an embodiment, a second recess RC2 may be defined in the second planarization layer VIA2. The second recess RC2 may pass through (e.g., may penetrate) the second planarization layer VIA2. The second recess RC2 may overlap with the first recess RC1. The first recess RC1 and the second recess RC2 may constitute one trench portion TC.

The electrode layer PXE may be disposed on the second planarization layer VIA2. The electrode layer PXE may include a first pixel electrode PXE1, a second pixel electrode PXE2, a third pixel electrode PXE3, and a metal pattern MP. The first pixel electrode PXE1, the second pixel electrode PXE2, the third pixel electrode PXE3, and the metal pattern MP may not overlap with the trench portion TC.

In an embodiment, the trench portion TC may be disposed between the electrodes PXE1, PXE2, and PXE3, and the metal pattern MP included in the electrode layer PXE.

A shape of the trench portion TC is not particularly limited. In an embodiment, the trench portion TC may surround (e.g., around peripheries of) the electrodes PXE1, PXE2, and PXE3, and the metal pattern MP included in the electrode layer PXE. However, the present disclosure is not limited thereto, and the trench portion TC may surround (e.g., around) a portion of the electrodes PXE1, PXE2, and PXE3, and the metal pattern MP included in the electrode layer PXE.

The pixel defining layer PDL may be disposed on the electrode layer PXE. The pixel defining layer PDL may cover the metal pattern MP. The pixel defining layer PDL may be disposed in the first recess RC1 and the second recess RC2.

The pixel defining layer PDL may fill the trench portion TC. The pixel defining layer PDL may be disposed in the trench portion TC to contact a bottom surface of the trench portion TC.

The spacer SPC may be disposed on the pixel defining layer PDL. The spacer SPC may overlap with the metal pattern MP. The spacer SPC may be spaced apart from the first pixel electrode PXE1 and the second pixel electrode PXE2 in a plan view. The spacer SPC may not overlap with the first pixel electrode PXE1 and the second pixel electrode PXE2.

The spacer SPC may be disposed on the pixel defining layer PDL, and may maintain or substantially maintain a gap between the encapsulation layer and the substrate SUB. The metal pattern MP may overlap with the spacer SPC, and may support the spacer SPC.

FIGS. 8 to 20 are views illustrating a method of manufacturing a display panel according to an embodiment. For example, FIGS. 8 to 20 may illustrate a method of manufacturing the display panel 10 of FIG. 3. Therefore, in FIGS. 8 to 20, the same or substantially the same (or similar) components as those described above with reference to FIG. 3 are denoted with the same reference symbols, and thus, redundant description thereof may not be repeated.

Figure 8:
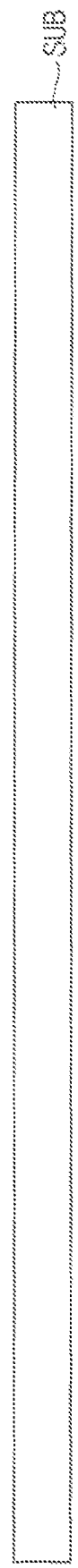
FIGS. 8-20 are views illustrating a method of manufacturing a display panel according to an embodiment.
Figure 9:
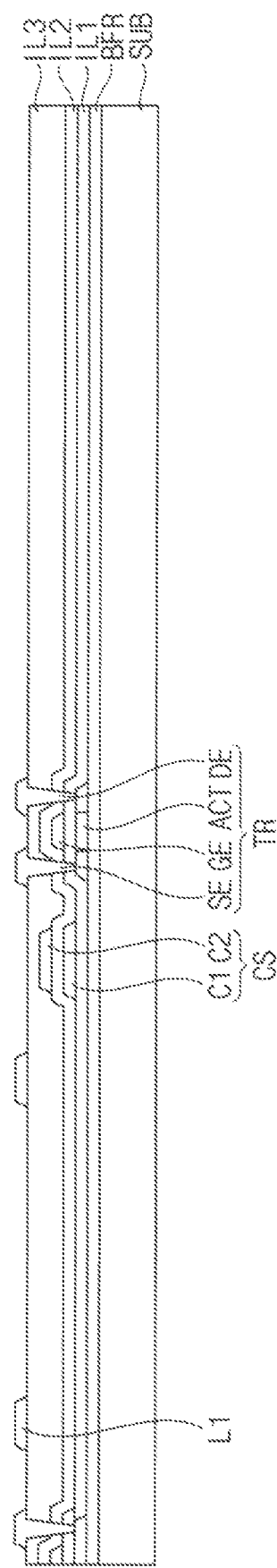

Referring to FIGS. 8 and 9, a buffer layer BFR, a first insulation layer IL1, a second insulation layer IL2, a third insulation layer IL3, a transistor TR, a storage capacitor CS, and a first wiring L1 may be formed on a substrate SUB. An active layer ACT, a gate electrode GE, a source electrode SE, and a drain electrode DE may form the transistor TR. A first capacitor electrode C1 and a second capacitor electrode C2 may form the storage capacitor CS.

Figure 10:
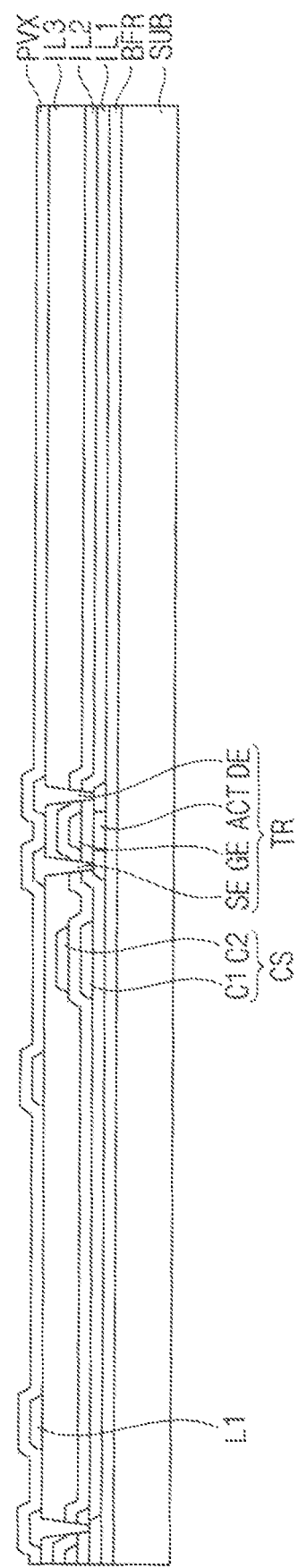

Referring to FIG. 10, a passivation layer PVX may be formed on the third insulation layer IL3. The passivation layer PVX may be formed to cover the source electrode SE, the drain electrode DE, and the first wiring L1.

Figure 11:
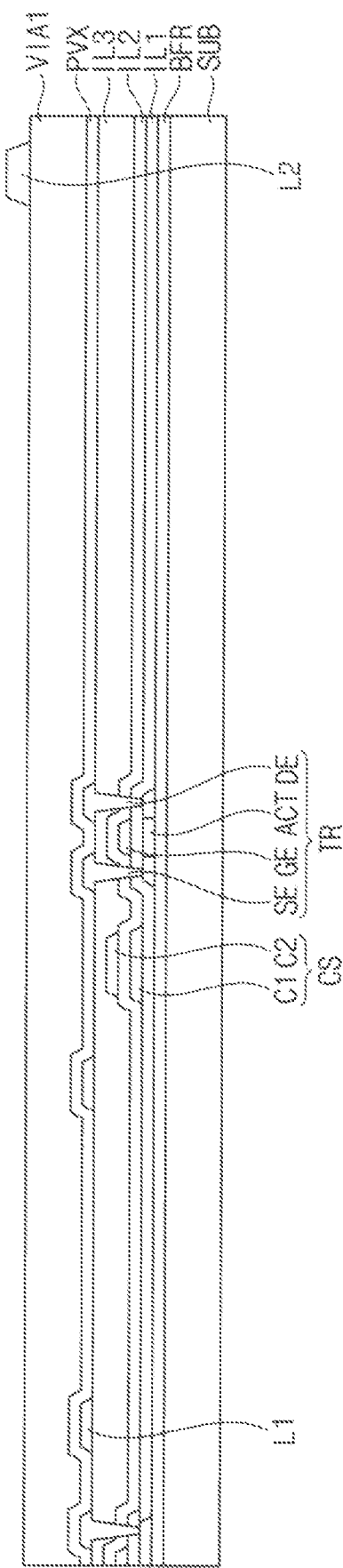

Referring to FIG. 11, a first planarization layer VIA1 may be formed on the passivation layer PVX. The first planarization layer VIA1 may be formed of an organic material. The first planarization layer VIA1 may flatten or substantially flatten an upper surface of the passivation layer PVX. A second wiring L2 may be formed on the first planarization layer VIA1.

Figure 12:
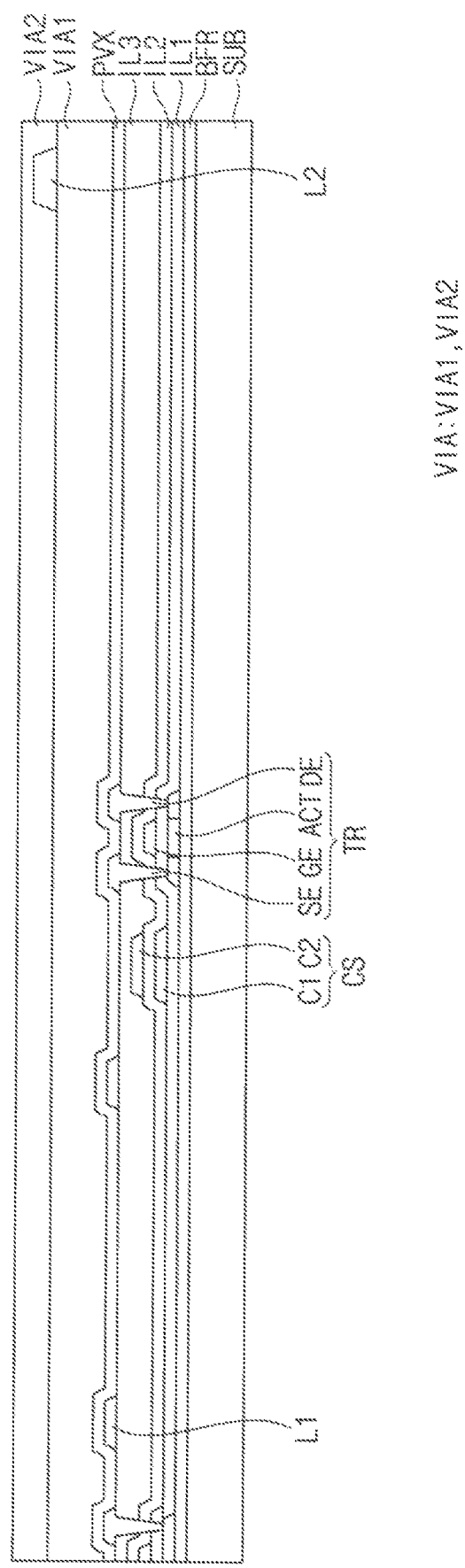

Referring to FIG. 12, a second planarization layer VIA2 may be formed on the passivation layer PVX to cover the second wiring L2. The second planarization layer VIA2 may be formed of an organic material. The second planarization layer VIA2 may flatten or substantially flatten the upper surface. In other words, the second planarization layer VIA2 may have a flat or substantially flat upper surface.

Figure 13:
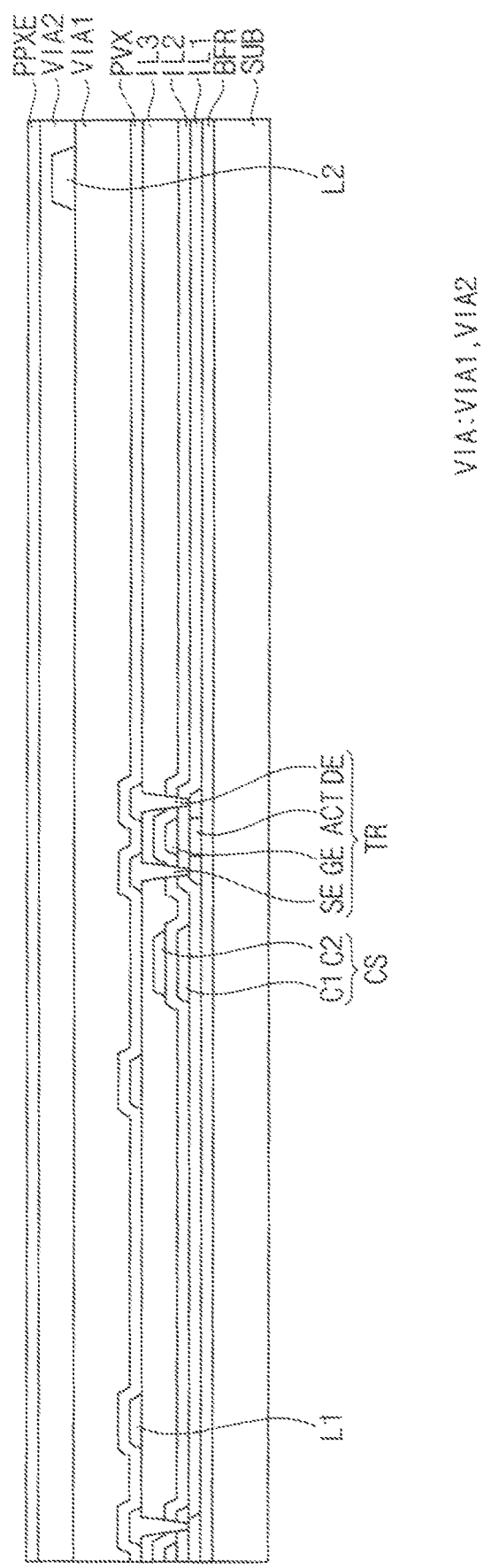
Figure 14:
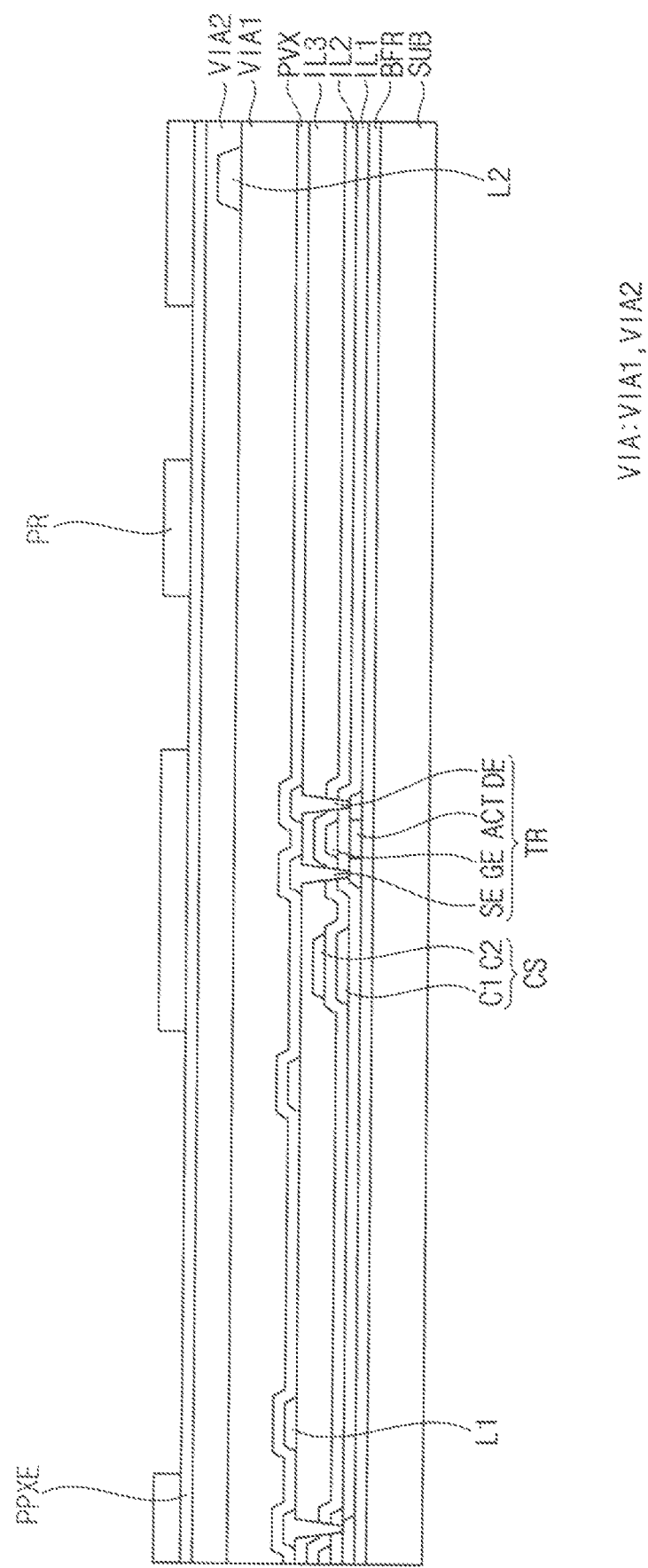
Figure 15:
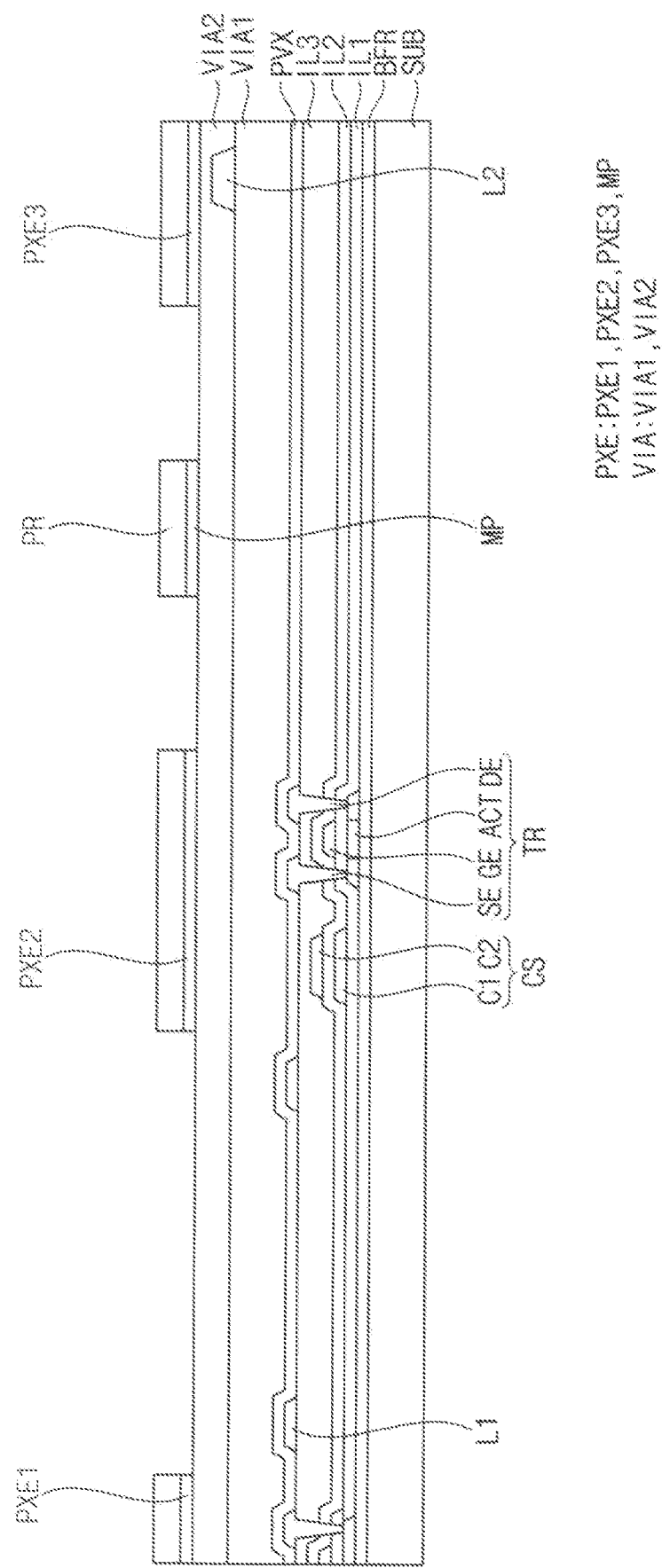

Referring to FIGS. 13 to 15, a preliminary electrode layer PPXE may be formed on the second planarization layer VIA2. The preliminary electrode layer PPXE may be formed of a metal.

In an electrode layer patterning process, a photoresist layer may be applied on the preliminary electrode layer PPXE. A photoresist pattern PR may be formed by exposing and developing the photoresist layer. The photoresist pattern PR may have a pattern shape corresponding to that of the electrode layer PXE.

The preliminary electrode layer PPXE may be patterned using the photoresist pattern PR as a mask. The preliminary electrode layer PPXE may be patterned to form an electrode layer PXE. The electrode layer PXE may include a first pixel electrode PXE1, a second pixel electrode PXE2, a third pixel electrode PXE3, and a metal pattern MP. Accordingly, the first pixel electrode PXE1, the second pixel electrode PXE2, the third pixel electrode PXE3, and the metal pattern MP may be formed through the electrode layer patterning process. Also, the planarization layer VIA may be exposed through the electrode layer patterning process.

Figure 16:
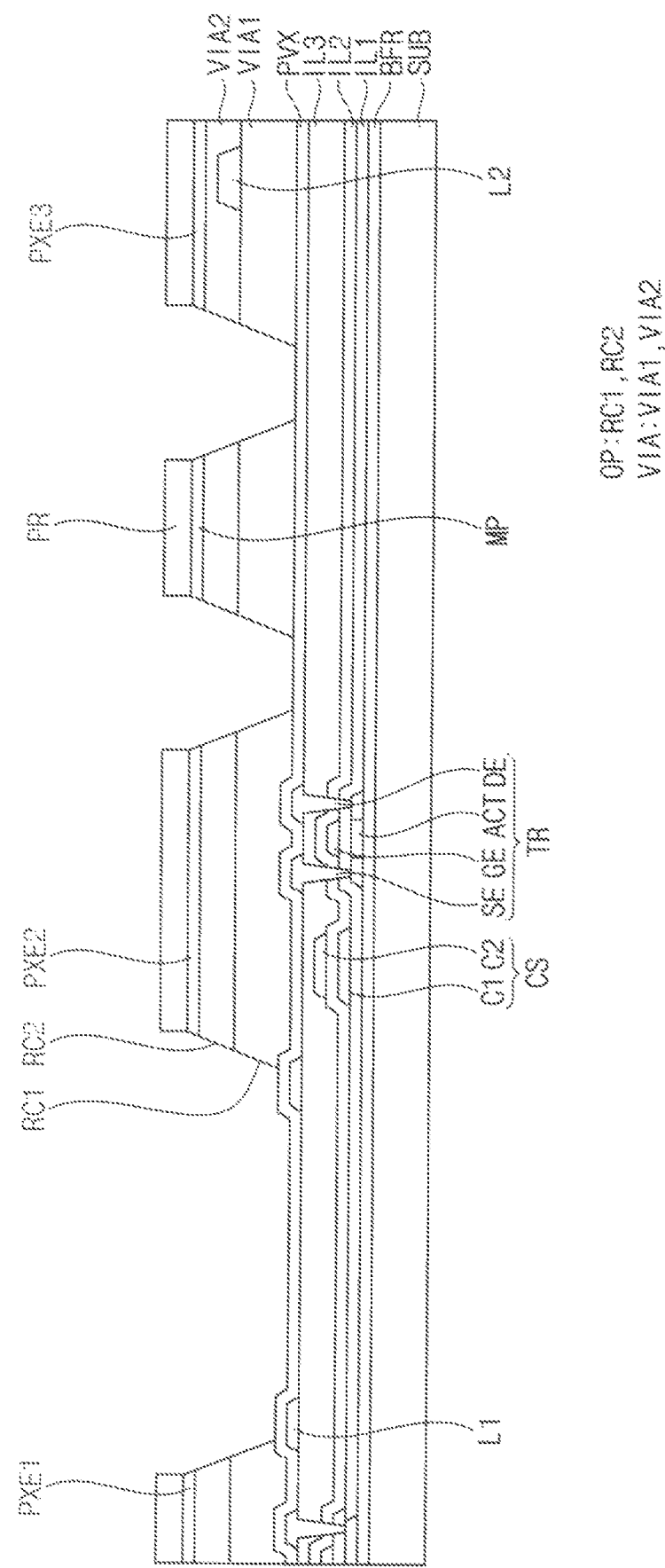

Referring to FIG. 16, a planarization layer etching process may be performed. The photoresist pattern PR may remain on the electrode layer PXE. The planarization layer VIA may be etched using the electrode layer PXE as a mask.

In an embodiment, a portion of the planarization layer VIA between the first pixel electrode PXE1 and the second pixel electrode PXE2 may be etched by using the first pixel electrode PXE1 and the second pixel electrode PXE2 as a mask. In an embodiment, a portion of the planarization layer VIA between the second pixel electrode PXE2 and the metal pattern MP may be etched by using the second pixel electrode PXE2 and the metal pattern MP as a mask. In an embodiment, a portion of the planarization layer VIA between the metal pattern MP and the third pixel electrode PXE3 may be etched by using the metal pattern MP and the third pixel electrode PXE3 as a mask.

The second planarization layer VIA2 may be etched to form a second recess RC2. The second recess RC2 may pass through (e.g., may penetrate) the second planarization layer VIA2. The first planarization layer VIA1 may be etched to form a first recess RC1. The first recess RC1 may pass through (e.g., may penetrate) the first planarization layer VIA1. The first recess RC1 may expose the passivation layer PVX. The first recess RC1 and the second recess RC2 may form an opening OP.

Because the electrode layer PXE is used as a mask, the opening OP may be formed between each of the first pixel electrode PXE1, the second pixel electrode PXE2, the third pixel electrode PXE3, and the metal pattern MP. In other words, in a plan view, the opening OP may be spaced apart from the first pixel electrode PXE1, the second pixel electrode PXE2, the third pixel electrode PXE3, and the metal pattern MP.

In an embodiment, an edge of the opening OP may be formed to coincide with at least a portion of an edge of the electrode layer PXE (e.g., refer to FIG. 4). In another embodiment, an edge of the opening OP may have an undercut shape (e.g., refer to FIG. 5). In another embodiment, at least a portion of an edge of the electrode layer PXE may be formed more inwardly than an edge of the opening OP (e.g., refer to FIG. 6).

In the planarization layer etching process, because the photoresist pattern PR remains on the electrode layer PXE, the electrode layer PXE may not be damaged.

Figure 17:
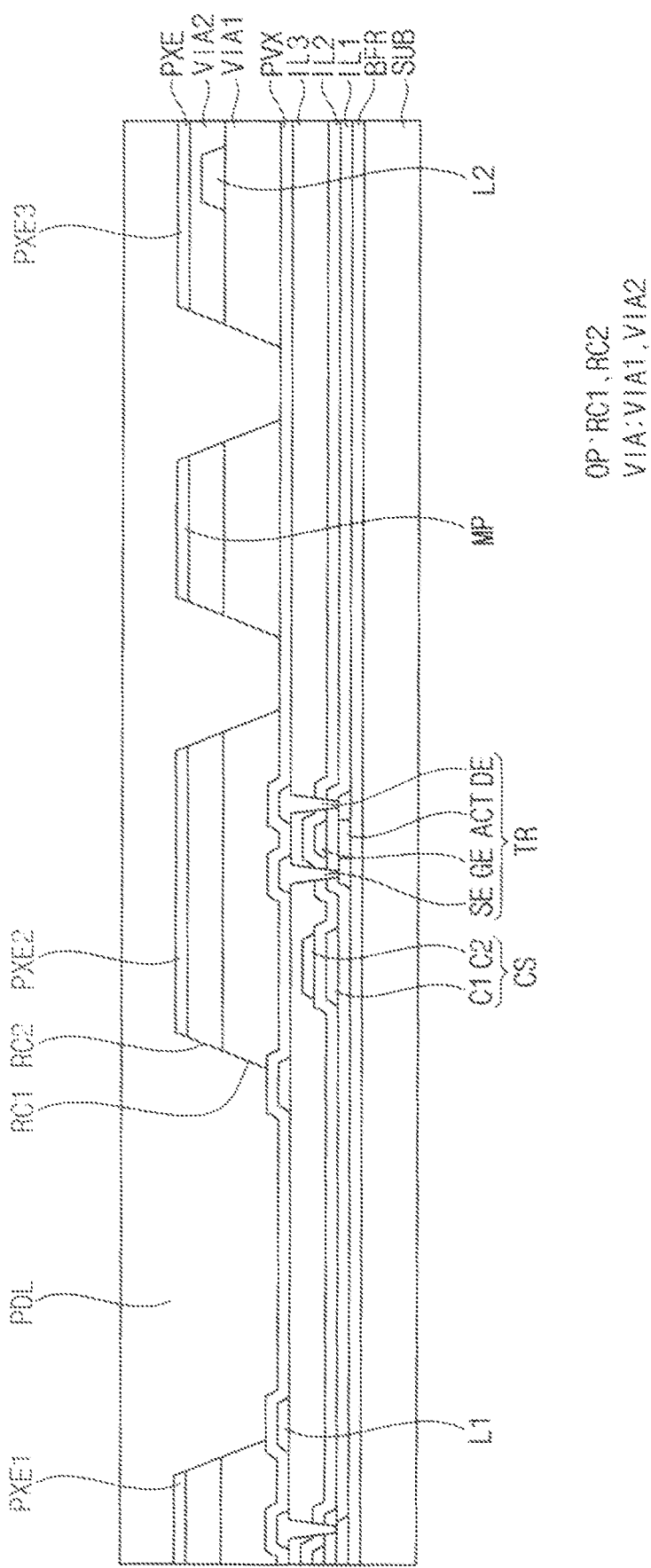

Referring to FIG. 17, a pixel defining layer PDL may be formed on the electrode layer PXE. The pixel defining layer PDL may fill the opening OP. The pixel defining layer PDL may contact the passivation layer PVX through the opening OP.

Figure 18:
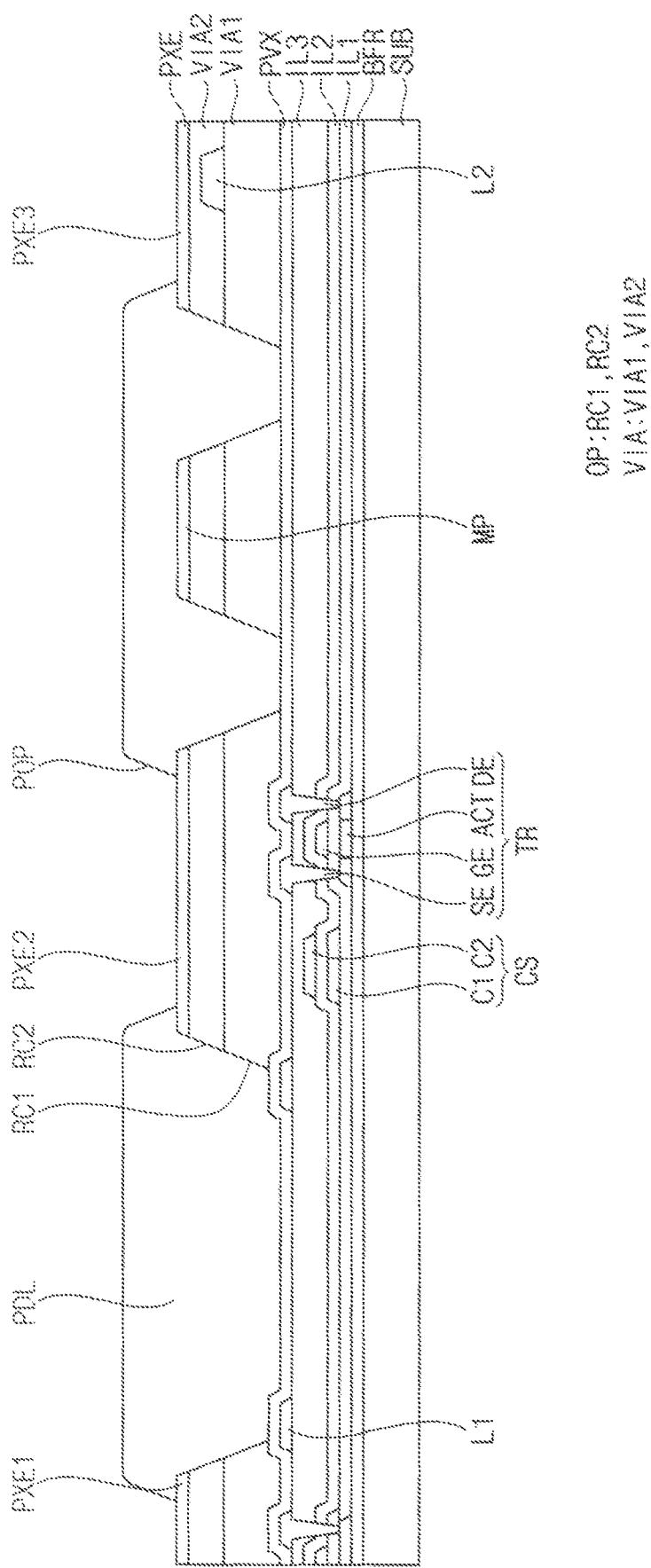

Referring to FIG. 18, a portion of the pixel defining layer PDL overlapping with the first pixel electrode PXE1, the second pixel electrode PXE2, and the third pixel electrode PXE3 may be removed to form a pixel opening POP. Accordingly, the pixel opening POP overlapping with the first pixel electrode PXE1, the second pixel electrode PXE2, and the third pixel electrode PXE3 may be formed in the pixel defining layer PDL.

Figure 19:
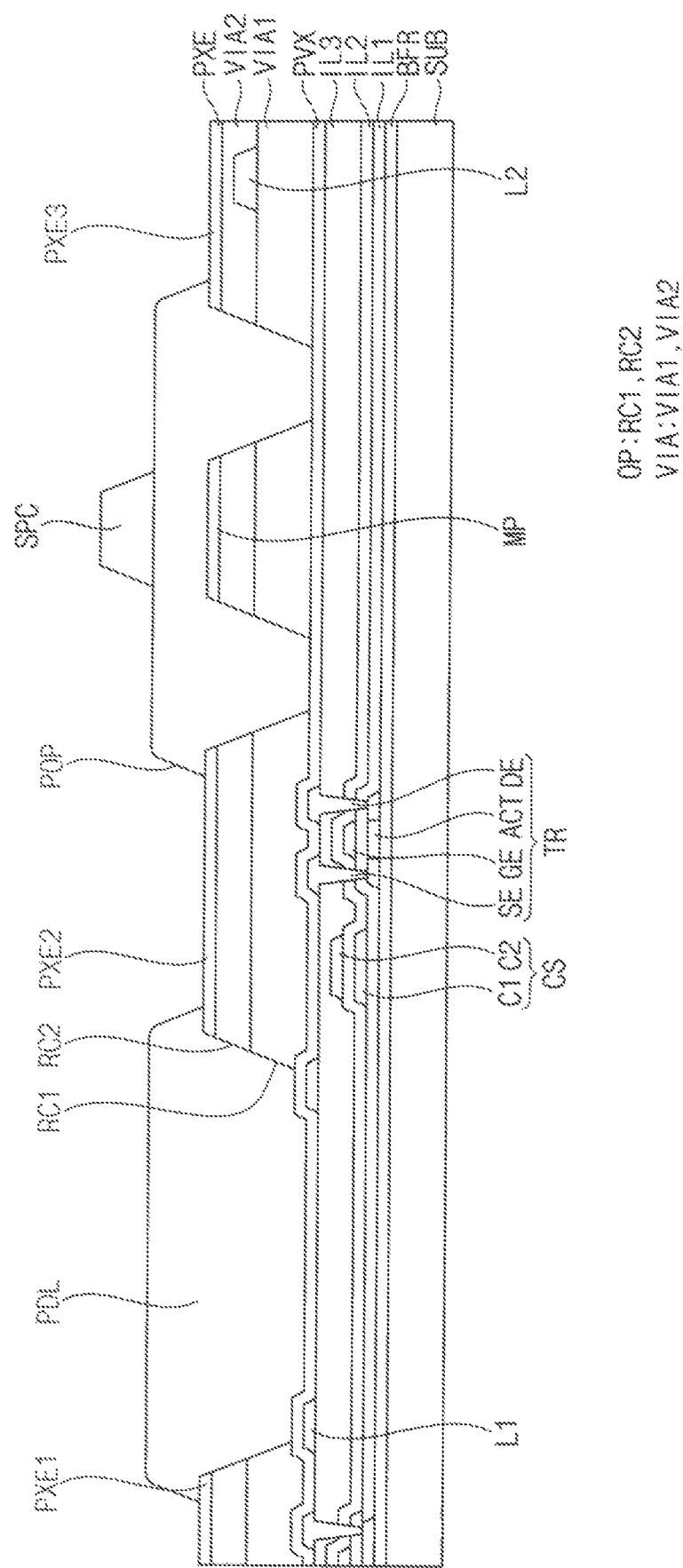

Referring to FIG. 19, a spacer SPC may be formed on the pixel defining layer PDL. The spacer SPC may be formed between the pixel electrodes. The spacer SPC may be formed to overlap with the metal pattern MP. The metal pattern MP may support the spacer SPC.

Figure 20:
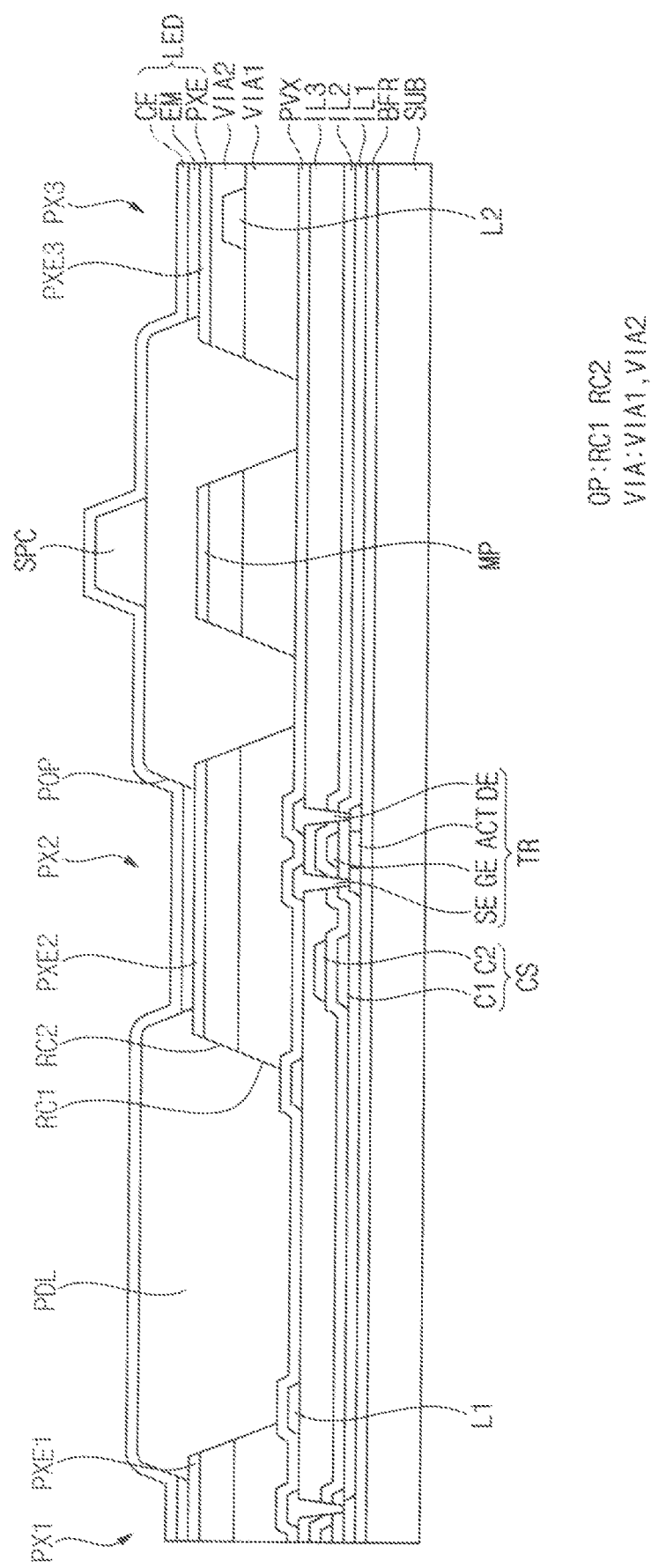

Referring to FIG. 20, a light emitting layer EM may be formed in the pixel opening POP. A common electrode CE may be formed on the pixel defining layer PDL. The common electrode CE may cover the spacer SPC and the light emitting layer EM. Each of the first pixel electrode PXE1, the second pixel electrode PXE2, and the third pixel electrode PXE3, with the corresponding light emitting layer EM thereon and the common electrode CE, may form a light emitting diode LED.

In an embodiment, the planarization layer VIA may be removed using the electrode layer PXE as a mask. By using the electrode layer PXE as a mask, a manufacturing process of the display panel may be simplified.

Also, by using the electrode layer PXE as a mask, the edge of the opening OP may coincide with at least a portion of the edge of the electrode layer PXE, or the edge of the opening OP may have an undercut shape. Accordingly, an open rate of the planarization layer VIA may be increased.

Figure 21:
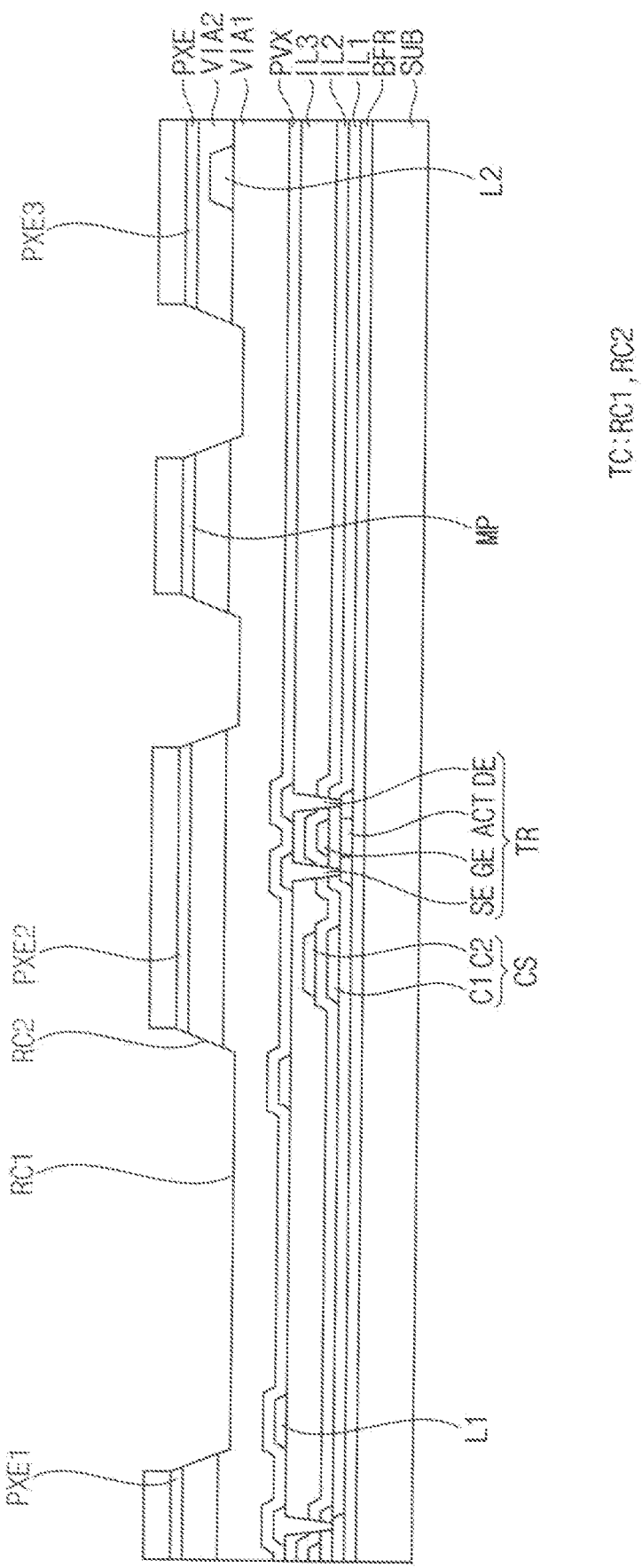
FIGS. 21-23 are views illustrating a method of manufacturing a display panel according to another embodiment.
Figure 22:
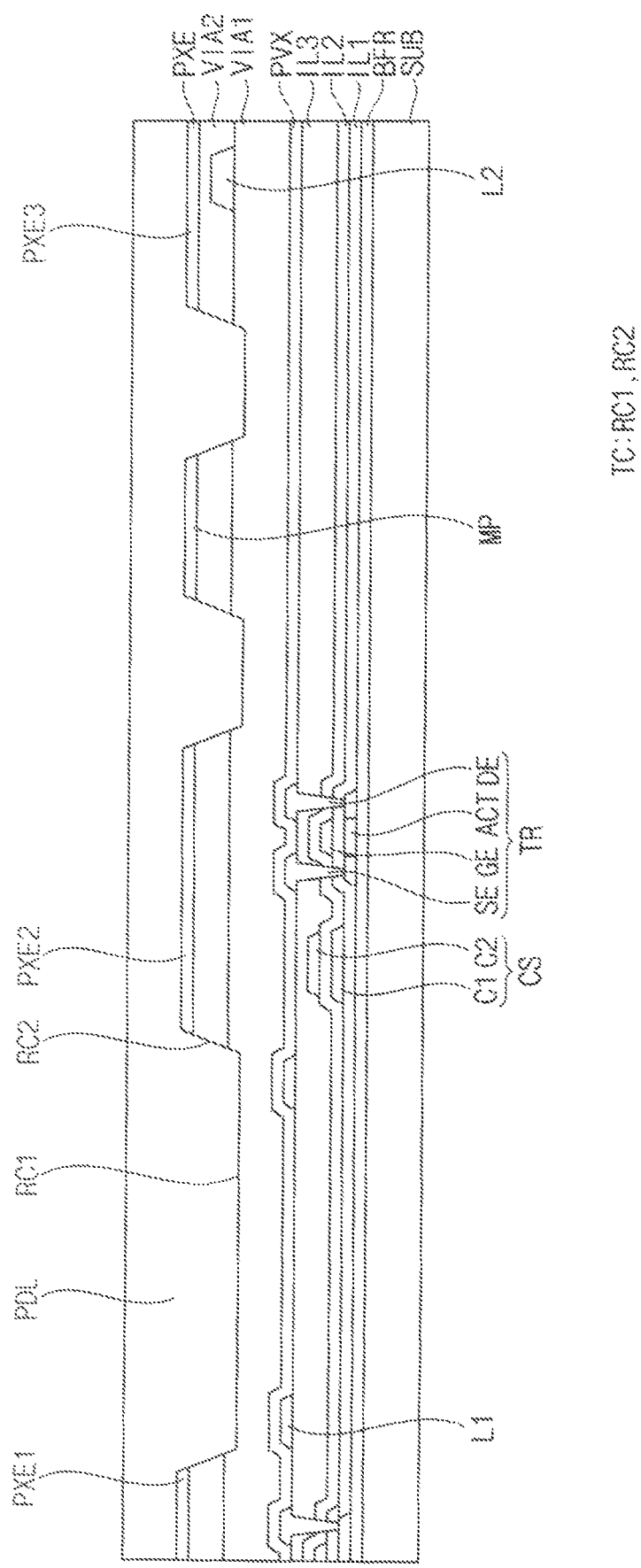
Figure 23:
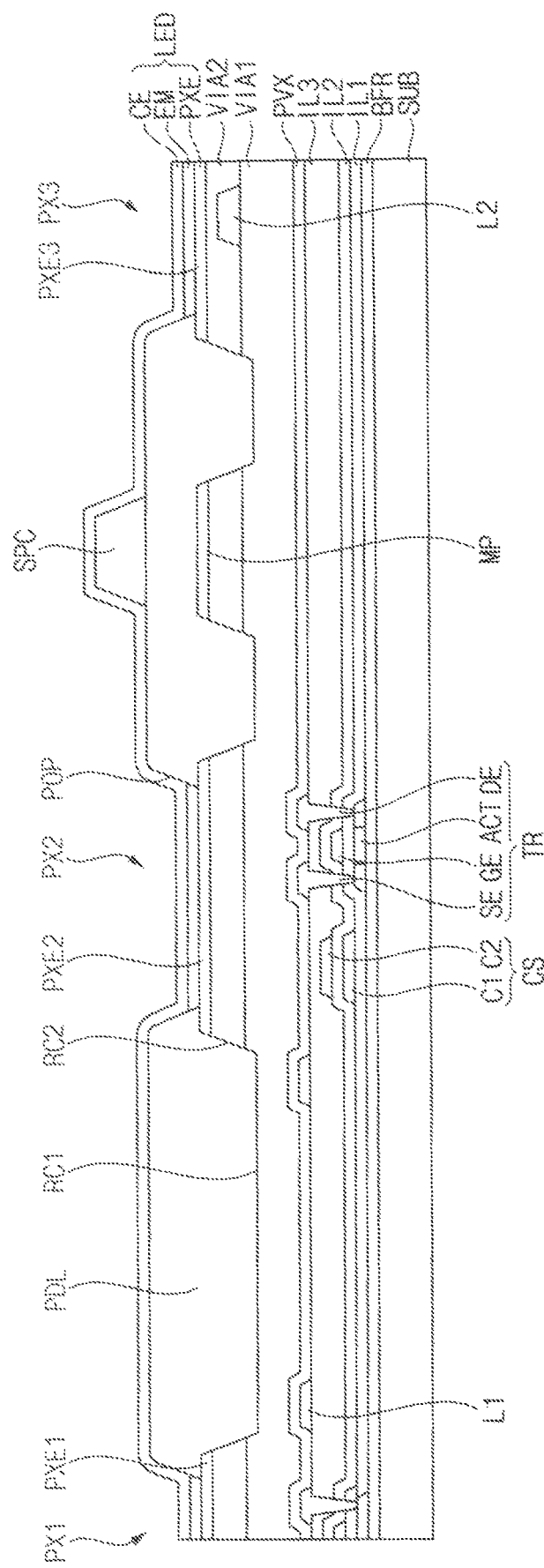

FIGS. 21 to 23 are views illustrating a method of manufacturing a display panel according to another embodiment. For example, the method shown in FIGS. 21 to 23 may be a method of manufacturing the display panel 11 shown in FIG. 7. Therefore, in FIGS. 21 to 23, the same or substantially the same (or similar) components as those described above with reference to FIG. 7 are denoted with the same reference symbols, and thus, redundant description thereof may not be repeated.

Referring to FIG. 21, a planarization layer etching process may be performed. The photoresist pattern PR may remain on the electrode layer PXE. The planarization layer VIA may be etched using the electrode layer PXE as a mask.

In an embodiment, a portion of the planarization layer VIA between the electrode layers PXE may be etched using the electrode layer PXE as a mask.

The second planarization layer VIA2 may be etched to form a second recess RC2. The second recess RC2 may pass through (e.g., may penetrate) the second planarization layer VIA2. The first planarization layer VIA1 may be etched to form a first recess RC1. The first recess RC1 may have a trench shape. In other words, a portion of the planarization layer VIA may remain under (e.g., underneath) the first recess RC1. The first recess RC1 and the second recess RC2 may form a trench portion TC.

Because the electrode layer PXE is used as a mask, the trench portion TC may be formed between the first pixel electrode PXE1, the second pixel electrode PXE2, the third pixel electrode PXE3, and the metal pattern MP. In other words, in a plan view, the trench portion TC may be spaced apart from the first pixel electrode PXE1, the second pixel electrode PXE2, the third pixel electrode PXE3, and the metal pattern MP.

Referring to FIG. 22, a pixel defining layer PDL may be formed on the electrode layer PXE. The pixel defining layer PDL may fill the trench portion TC. The pixel defining layer PDL may contact a side surface and a bottom surface of the trench portion TC. In an embodiment, the pixel defining layer PDL may not contact the passivation layer PVX.

Referring to FIG. 23, a pixel opening POP overlapping with the first pixel electrode PXE1, the second pixel electrode PXE2, and the third pixel electrode PXE3 may be formed in the pixel defining layer PDL.

A spacer SPC may be formed on the pixel defining layer PDL. The spacer SPC may be formed between the pixel electrodes. The spacer SPC may be formed to overlap with the metal pattern MP. The metal pattern MP may support the spacer SPC.

An light emitting layer EM may be formed in the pixel opening POP. A common electrode CE may be formed on the pixel defining layer PDL.

The display panel and the method of manufacturing the display panel according to various embodiments of the present disclosure may be applied to a display device included in a computer, a notebook, a mobile phone, a smartphone, a smart pad, a PMP, a PDA, an MP3 player, or the like.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display panel comprising:
a substrate;
a transistor on the substrate;
a planarization layer on the transistor, and defining at least one recess;
a first pixel electrode and a second pixel electrode on the planarization layer, with the recess therebetween in a plan view;
a metal pattern on the planarization layer, and adjacent to the first pixel electrode or the second pixel electrode;
a pixel defining layer on the metal pattern and filling the recess; and
a spacer on the pixel defining layer and overlapping with the metal pattern.

2. The display panel of claim 1, wherein at least a portion of an edge of each of the first pixel electrode and the second pixel electrode is connected to an edge of the recess.

3. The display panel of claim 1, wherein at least a portion of an edge of each of the first pixel electrode and the second pixel electrode protrudes to cover a portion of the recess.

4. The display panel of claim 1, wherein the spacer is spaced from the first pixel electrode and the second pixel electrode in a plan view.

5. The display panel of claim 1, further comprising a passivation layer located between the transistor and the planarization layer.

6. The display panel of claim 5, wherein the recess passes through the planarization layer.

7. The display panel of claim 6, wherein the recess exposes the passivation layer.

8. The display panel of claim 7, wherein the passivation layer contacts the pixel defining layer.

9. The display panel of claim 1, wherein a portion of the planarization layer is located under the recess.

10. The display panel of claim 9, wherein the recess is defined in an upper surface of the planarization layer.

11. A method of manufacturing a display panel, comprising:
forming a transistor on a substrate;
forming a planarization layer on the transistor;
forming a preliminary electrode layer on the planarization layer;
patterning the preliminary electrode layer to form a first pixel electrode and a second pixel electrode adjacent to the first pixel electrode, and to expose the planarization layer; and
forming a recess in the planarization layer by removing a portion of the planarization layer located between the first pixel electrode and the second pixel electrode.

12. The method of claim 11, wherein the recess is formed to be spaced from the first pixel electrode and the second pixel electrode in a plan view.

13. The method of claim 11, wherein the patterning of the preliminary electrode layer includes forming a metal pattern adjacent to the first pixel electrode and the second pixel electrode.

14. The method of claim 13, further comprising forming a pixel defining layer on the first pixel electrode, the second pixel electrode, and the metal pattern.

15. The method of claim 14, wherein the pixel defining layer fills the recess.

16. The method of claim 14, further comprising forming a spacer on the pixel defining layer.

17. The method of claim 16, wherein the spacer overlaps with the metal pattern.

18. The method of claim 14, further comprising forming a passivation layer on the transistor.

19. The method of claim 18, wherein the recess passes through the planarization layer, and exposes the passivation layer.

20. The method of claim 11, wherein a portion of the planarization layer remains under the recess.

* * * * *